US012482637B2

(12) United States Patent
Ikeda et al.

(10) Patent No.: US 12,482,637 B2
(45) Date of Patent: Nov. 25, 2025

(54) PLASMA SOURCE AND PLASMA PROCESSING APPARATUS

(71) Applicant: Tokyo Electron Limited, Tokyo (JP)

(72) Inventors: Taro Ikeda, Yamanashi (JP); Yuki Osada, Yamanashi (JP); Hiroyuki Miyashita, Yamanashi (JP); Hiroyuki Onoda, Tokyo (JP); Satoru Kawakami, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 388 days.

(21) Appl. No.: 17/869,362

(22) Filed: Jul. 20, 2022

(65) Prior Publication Data

US 2023/0033323 A1 Feb. 2, 2023

(30) Foreign Application Priority Data

Jul. 21, 2021 (JP) ................................ 2021-120961

(51) Int. Cl.
*H01J 37/32* (2006.01)

(52) U.S. Cl.
CPC .. *H01J 37/32449* (2013.01); *H01J 37/32238* (2013.01); *H01J 37/32568* (2013.01)

(58) Field of Classification Search
CPC ........... H01J 37/32568; H01J 37/32449; H01J 37/32238
See application file for complete search history.

(56) References Cited

U.S. PATENT DOCUMENTS

| | | | | |
|---|---|---|---|---|
| 7,491,908 B2 | 2/2009 | Iino | | |
| 2002/0020691 A1* | 2/2002 | Jewett | ............... | H01J 37/32009 219/121.43 |
| 2007/0151956 A1 | 7/2007 | Iino | | |
| 2009/0035945 A1* | 2/2009 | Fujii | ................. | H01L 21/67069 438/758 |
| 2009/0151636 A1* | 6/2009 | White | ............... | H01J 37/32091 118/723 R |
| 2010/0282711 A1* | 11/2010 | Chung | ............. | H01J 37/32935 118/712 |
| 2016/0284516 A1* | 9/2016 | Ikeda | ................ | H01J 37/32192 |

FOREIGN PATENT DOCUMENTS

| | | |
|---|---|---|
| JP | 2014049529 A | 3/2014 |
| JP | 2017150023 A | 8/2017 |
| KR | 10-2008-0036157 A | 4/2008 |

* cited by examiner

*Primary Examiner* — Yuechuan Yu
(74) *Attorney, Agent, or Firm* — Fenwick & West LLP

(57) ABSTRACT

There is provided a plasma source comprising a first chamber configured to form a flat first plasma generation space, and having a first wall and a second wall, a gas supply configured to supply gas into the first chamber, an electromagnetic wave supply having a dielectric window that is provided in an opening provided in the first wall to face the first plasma generation space, and configured to supply an electromagnetic wave through the dielectric window into the first chamber. The plasma source comprises a plasma supply configured to supply radicals contained in plasma that is generated from the gas supplied into the first chamber by the electromagnetic wave to an outside of the first chamber, and a plasma ignition source provided in the first chamber to protrude from an inner wall of the second wall facing the dielectric window and to be separated from the dielectric window.

20 Claims, 6 Drawing Sheets

PLASMA SOURCE AND PLASMA PROCESSING APPARATUS

CROSS-REFERENCE TO RELATED APPLICATIONS

This application claims priority to Japanese Patent Application No. 2021-120961 filed on Jul. 21, 2021, the entire contents of which are incorporated herein by reference.

TECHNICAL FIELD

The present disclosure relates to a plasma source and a plasma processing apparatus.

BACKGROUND

It is important to form film using plasma so as to obtain a high-quality film at low temperature. In recent years, thinning has been progressed in film formation, and film formation by a plasma ALD (Atomic Layer Deposition) method has been introduced. By using plasma, a high-quality thin film can be obtained at low temperature, but electrical damage or physical damage to the film may become a problem. In order to solve the problem, the film formation by the ALD method using a remote source has been proposed.

For example, Japanese Laid-open Patent Publication Nos. 2017-150023 and 2014-049529 disclose the configuration of a remote plasma processing apparatus having an ICP (Inductively Coupled Plasma) type remote plasma source. When the ICP type remote source is used as the remote source in this way, the stable range of plasma may be narrow, and plasma ignition may not be easy.

SUMMARY

The present disclosure provides a plasma source that facilitates plasma ignition.

In accordance with an aspect of the present disclosure, there is provided a plasma source comprising: a first chamber configured to form a flat first plasma generation space, and having a first wall and a second wall that have a largest area among a plurality of walls constituting the first chamber and face each other; a gas supply configured to supply gas into the first chamber; an electromagnetic wave supply having a dielectric window that is provided in an opening provided in the first wall to face the first plasma generation space, and configured to supply an electromagnetic wave through the dielectric window into the first chamber; a plasma supply configured to supply radicals contained in plasma that is generated from the gas supplied into the first chamber by the electromagnetic wave to an outside of the first chamber; and a plasma ignition source provided in the first chamber to protrude from an inner wall of the second wall facing the dielectric window and to be separated from the dielectric window.

DETAILED DESCRIPTION

Figure 1:
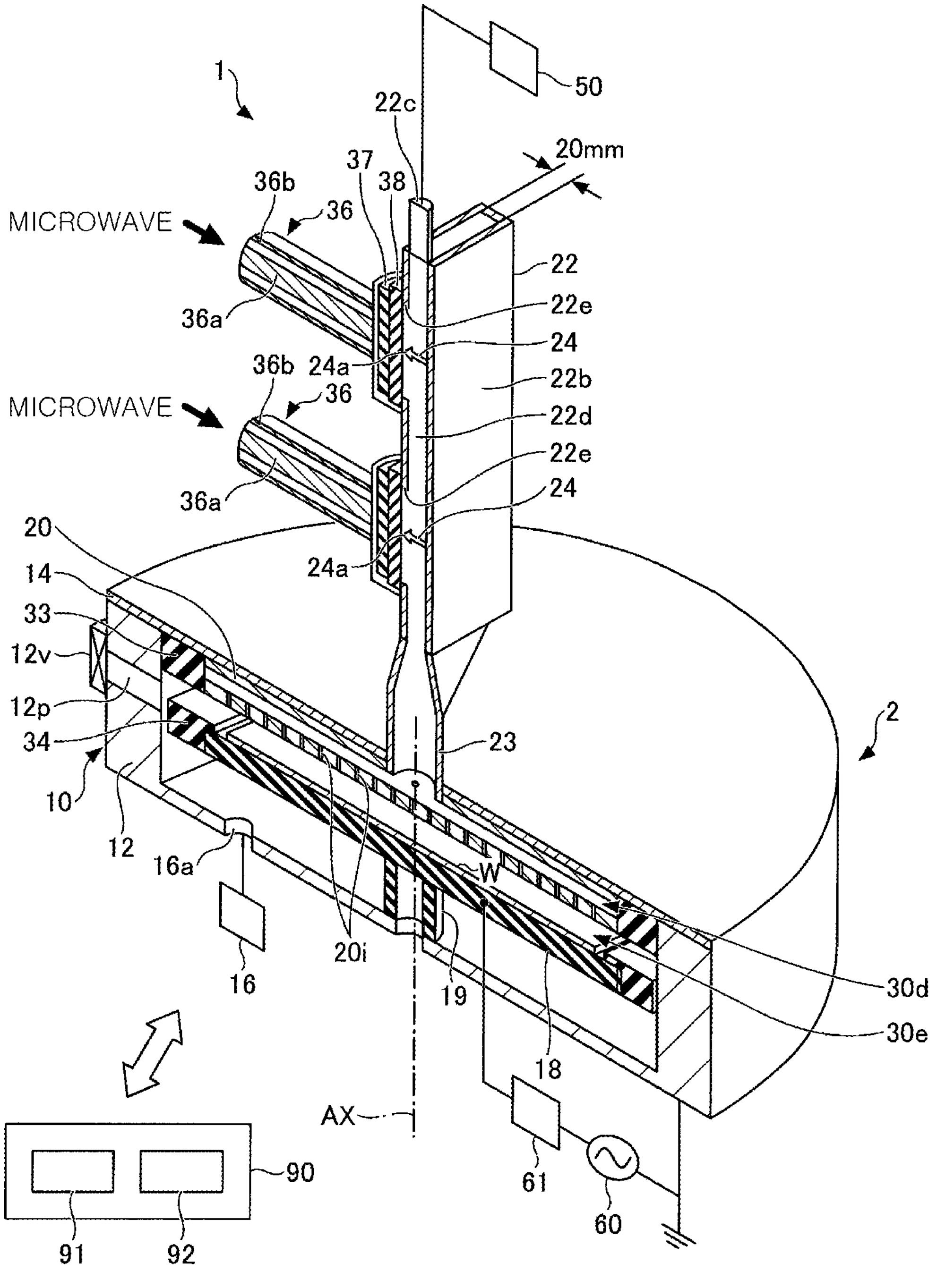
FIG. 1 is a sectional perspective view illustrating a plasma processing apparatus according to a first embodiment.

Hereinafter, embodiments for carrying out the present disclosure will be described with reference to the accompanying drawings. The same components will be denoted by the same reference numerals throughout the drawings, and a duplicate description thereof will be omitted.

First Embodiment

[Plasma Processing Apparatus]

Figure 2:
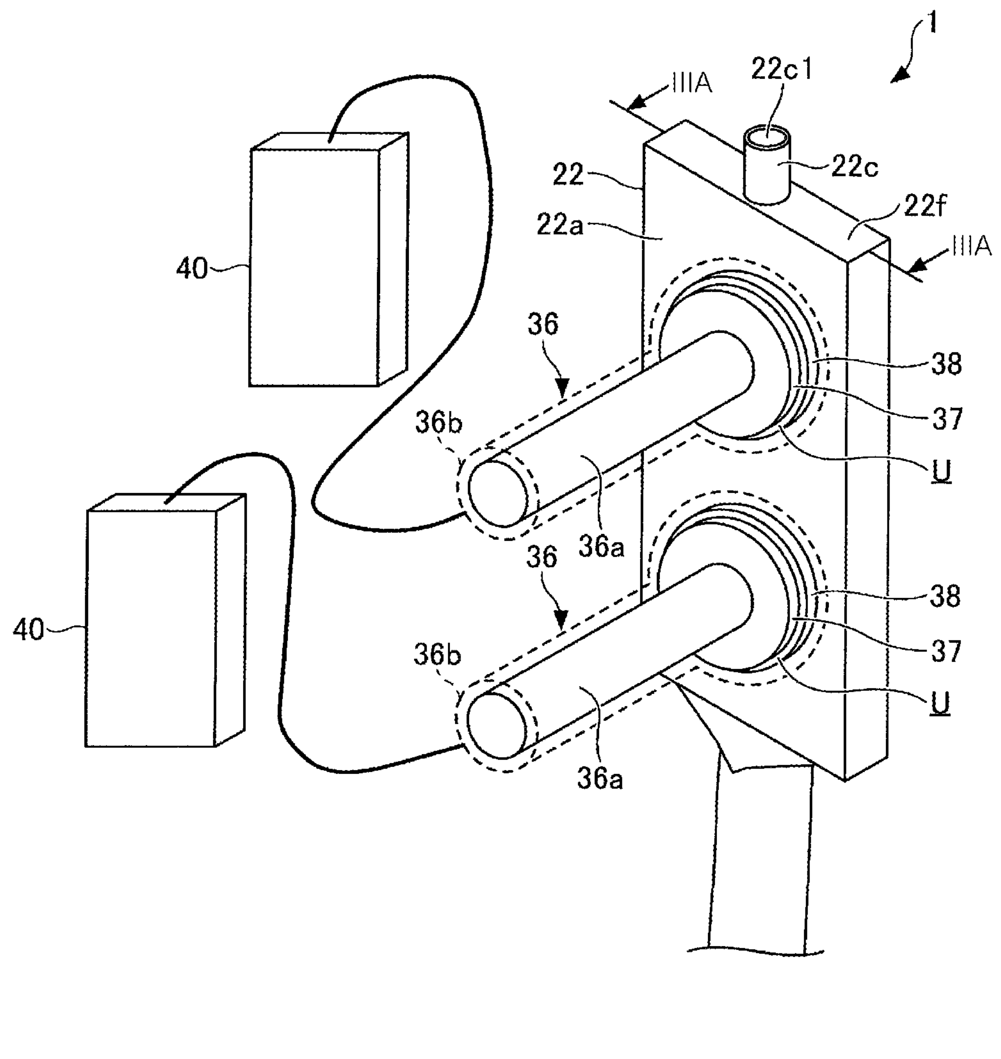
FIG. 2 is a diagram illustrating a plasma source according to the first embodiment.
Figure 3B:
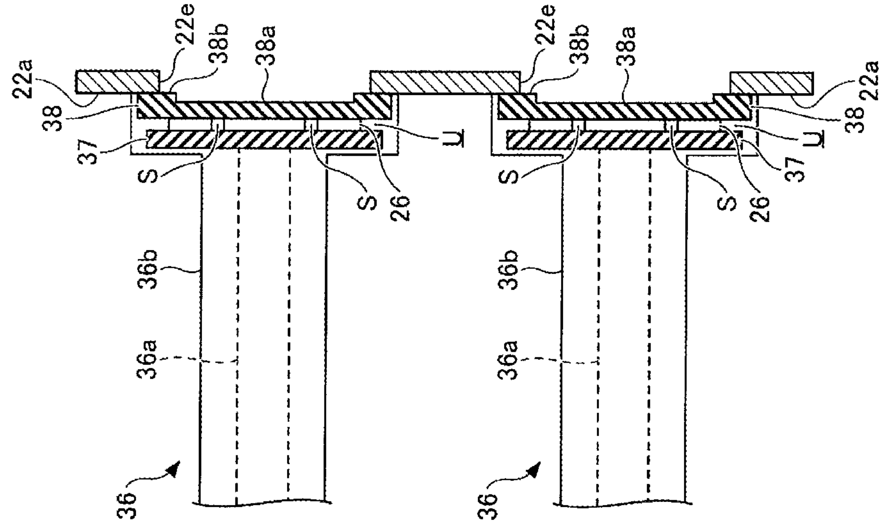
FIGS. 3A and 3B are enlarged views illustrating a part of the plasma source according to the first embodiment.
Figure 3A:
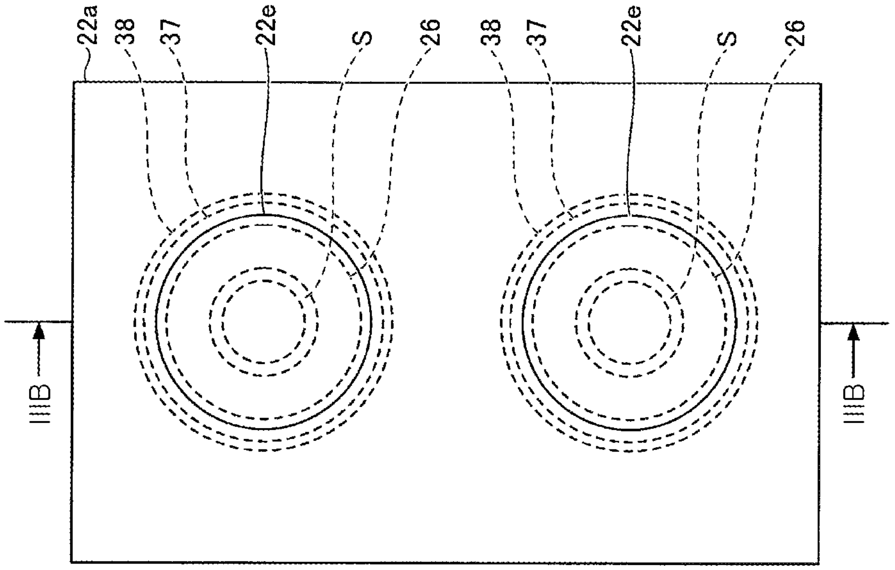

First, a plasma processing apparatus 2 according to a first embodiment will be described with reference to FIGS. 1, 2, 3A, and 3B. FIG. 1 is a sectional perspective view illustrating the plasma processing apparatus 2 according to the first embodiment. FIG. 2 is a diagram illustrating a plasma source 1 (remote plasma source) according to the first embodiment. FIGS. 3A and 3B are enlarged views illustrating a part of the plasma source 1 according to the first embodiment.

The plasma processing apparatus 2 shown in FIG. 1 has the plasma source 1. The plasma source 1 generates plasma from gas by the electric field of an electromagnetic wave. The electromagnetic wave includes a microwave. The frequency band of the microwave ranges from 300 MHz to 3 THz. The electromagnetic wave may include a VHF wave having the frequency band of 150 MHz to 300 MHz. Radicals in the generated plasma are supplied into a third plasma generation space 30*e* of the plasma processing apparatus 2, and is used for processing a substrate. The radicals transferred from the plasma source 1 are re-dissociated by high-frequency power applied to the plasma processing apparatus 2, and is used for processing the substrate.

The plasma processing apparatus 2 is provided with a third chamber 10. The third chamber 10 defines the third plasma generation space 30*e* for processing the substrate. The substrate W is processed in the third plasma generation space 30*e*. The third chamber 10 has an axis AX as a center line thereof. The axis AX is an axis extending in a vertical direction.

In an embodiment, the third chamber 10 includes a chamber body 12. The chamber body 12 has a substantially cylindrical shape, and is open at an upper portion thereof. The chamber body 12 provides a sidewall and a bottom of the third chamber 10. The chamber body 12 is formed of metal such as aluminum. The chamber body 12 is grounded.

The sidewall of the chamber body 12 provides a passage 12*p*. The substrate W passes through the passage 12*p*, when being transferred between the inside and outside of the third chamber 10. The passage 12*p* can be opened or closed by a gate valve 12*v*. The gate valve 12*v* is provided along the sidewall of the chamber body 12.

The third chamber 10 further includes an upper wall 14. The upper wall 14 is formed of metal such as aluminum. The upper wall 14 closes an opening at the upper portion of the chamber body 12. The upper wall 14 is grounded together with the chamber body 12.

The bottom of the third chamber 10 provides an exhaust port 16*a*. The exhaust port 16*a* is connected to an exhaust device 16. The exhaust device 16 includes a pressure controller such as an automatic pressure control valve and a vacuum pump such as a turbo molecular pump.

The plasma processing apparatus 2 further includes a mounting table 18. The mounting table 18 is provided in the third chamber 10. The mounting table 18 is configured to support the substrate W mounted thereon. The substrate W is mounted on the mounting table 18 in a substantially horizontal state. The mounting table 18 may be supported by a support member 19. The support member 19 extends upwards from the bottom of the third chamber 10. The mounting table 18 and the support member 19 may be formed of a dielectric material such as aluminum nitride.

The plasma processing apparatus 2 further includes a shower head 20. The shower head 20 is formed of metal such as aluminum. The shower head 20 has a substantially disc shape, and has a hollow structure. The shower head 20 shares the axis AX as its central axis. The shower head 20 is provided above the mounting table 18 and below the upper wall 14. The shower head 20 forms a ceiling portion that defines an internal space of the third chamber 10.

The shower head 20 further includes a diffusion chamber 30*d* therein. The shower head 20 provides a plurality of gas holes 20*i* that penetrate the shower head 20 in a thickness direction from a lower portion of the diffusion chamber 30*d*. The plurality of gas holes 20*i* are opened at a lower surface of the shower head 20, and the shower head 20 forms a gas path that introduces gas from the diffusion chamber 30*d* through the plurality of gas holes 20*i* into the third plasma generation space 30*e*. Thus, the gas is introduced toward the third plasma generation space 30*e* between the shower head 20 and the mounting table 18 in the third chamber 10. The mounting table 18 functions as a lower electrode, while the shower head 20 functions as an upper electrode.

An outer circumference of the shower head 20 is covered with a dielectric member 33 such as aluminum oxide. An outer circumference of the mounting table 18 is covered with a dielectric member 34 such as aluminum oxide. When a high frequency is not applied to the shower head 20, the dielectric member 33 may be omitted. However, it is better to dispose the dielectric member 33 in order to determine a region of the shower head 20 that functions as an electrode facing the mounting table 18. Further, in order to make a ratio of anodes and cathodes of the electrode as uniform as possible, it is better to dispose the dielectric member 33.

A high frequency power supply 60 is connected to the mounting table 18 via a matching device 61. The matching device 61 has an impedance matching circuit. The impedance matching circuit is configured to match the impedance of the load of the high frequency power supply 60 with the output impedance of the high frequency power supply 60. The high frequency supplied from the high frequency power supply 60 is lower than the frequency of the VHF wave and the microwave supplied to the plasma source 1 that will be described later, and is the frequency of 60 MHz or less. The high frequency may be 13.56 MHz. Further, the high frequency power supply 60 may be supplied to the shower head 20.

The plasma processing apparatus 2 has the plasma source 1 above the upper wall 14. FIG. 1 illustrates the sectional perspective view of the plasma source 1, together with the sectional perspective view of the third chamber 10. The plasma source 1 has a plasma supply 23 that supplies plasma, and the plasma supply 23 is fixed to the upper wall 14. The plasma supply 23 is a hollow member having a substantially cylindrical shape and formed of metal such as aluminum, and has a structure for supplying radicals and active species of gas. The plasma supply 23 shares the axis AX as its central axis. A lower end of the plasma supply 23 communicates with an opening formed in the center of the upper wall 14 of the third chamber 10.

A first chamber 22 is a rectangular waveguide that is flat around the axis AX. An upper end of the plasma supply 23 is extended in the width direction of the flat first chamber 22, and is connected to a lower end of the first chamber 22. The first chamber 22 is configured to form a flat first plasma generation space 22*d* therein. The first chamber 22 and the plasma supply 23 are made of a conductor such as aluminum, and have a ground potential. Further, the plasma source 1 has electromagnetic wave supplies 36 connected to a first wall 22*a* (see FIG. 2) of the first chamber 22.

Referring to FIGS. 1 and 2, the first chamber 22 has the first wall 22*a* and a second wall 22*b* that have the largest area among a plurality of walls constituting the first chamber 22 and face each other. On the first wall 22*a*, two electromagnetic wave supplies 36 are arranged side by side in a longitudinal direction (vertical direction) of the first chamber 22 with the axis AX as the center. The two electromagnetic wave supplies 36 have the same configuration.

The electromagnetic wave supply 36 has a dielectric window 38 that is provided in an opening 22*e* (see FIGS. 1 and 3) provided in the first wall 22*a* to face the first plasma generation space 22*d*, and is configured to supply the electromagnetic wave into the first chamber 22 through the dielectric window 38. As the electromagnetic wave, the VHF wave having the frequency of 150 MHz or more or the microwave is supplied. In this embodiment, the microwave propagates from a microwave oscillator 40 (see FIG. 2) through an input port to the electromagnetic wave supply 36. The electromagnetic wave supply 36 has a coaxial waveguide structure, and has a substantially cylindrical inner conductor 36*a* and a substantially cylindrical outer conductor 36*b* arranged concentrically around the inner conductor 36*a*. The microwave propagates between the inner conductor 36*a* and the outer conductor 36*b*, passes through a substantially disc-shaped quartz member 37, and propagates to the dielectric window 38 through a slot S of an antenna 26 provided in a gap U (see FIG. 3B) between the quartz member 37 and the dielectric window 38. Further, space may be provided between the inner conductor 36*a* and the outer conductor 36*b*, and alumina ($Al_2O_3$) or the like may be disposed therebetween. The microwave passes through the dielectric window 38, and is radiated from the opening 22*e* of the first wall 22*a* of the first chamber 22 into the first chamber 22. Further, the inner conductor 36*a*, the quartz member 37, and the dielectric window 38 are covered by the outer conductor 36*b*.

FIG. 3A is a sectional view taken along line IIIA-IIIA of FIG. 2, and is a plan view showing the vicinity of the opening 22*e* of the first wall 22*a* when seen from the inner wall side of the first wall 22*a*. FIG. 3B is a sectional view taken along line IBB-IIIB that passes through the center of the opening 22*e* of FIG. 3A. As shown in FIG. 3A, the antenna 26 of the conductor contacts a surface opposite to a surface of the dielectric window 38 exposed from the opening 22*e*, and a donut-shaped slot S is formed.

Further, as shown in FIG. 3B, the surface of the dielectric window 38 exposed from the opening 22*e* is circularly recessed in a central region 38*a* of the dielectric window 38, and the central region 38*a* is thinner than an outer peripheral region 38*b* of the dielectric window 38. This makes it possible to improve the characteristics of plasma ignition.

Turning back to FIG. 1, the plasma source 1 further has a gas supply 22*c* and a plasma ignition source 24. The gas supply 22*c* is connected to a gas supply source 50, and supplies gas supplied from the gas supply source 50 into the first chamber 22. As shown in FIG. 2, the gas supply 22*c* is provided on a third wall 22*f* having the smallest area among a plurality of walls constituting the first chamber 22. The gas supply 22*c* is provided in the center of the third wall 22*f* and above the dielectric window 38 of the electromagnetic wave supply 36. Two electromagnetic wave supplies 36 are installed in the direction (vertical direction) of the gas flowing in the first chamber 22 downward from the gas supply 22*c*. Thus, when the gas supplied from the gas supply 22*c* flows downward, by the electric field formed near the opening 22*e* by the microwave supplied from the electromagnetic wave supply 36, the gas can be decomposed and the plasma can be efficiently generated. Although the two electromagnetic wave supplies 36 are disposed on the first wall 22*a* in the direction (vertical direction) in which the gas flows in this embodiment, three or more electromagnetic wave supplies may be disposed, or only one electromagnetic wave supply may be disposed. As the number of electromagnetic wave supplies 36 increases, radical generation efficiency and plasma generation efficiency increase. In addition, the electromagnetic wave supply 36 may be provided on the second wall 22*b*.

The plasma supply 23 supplies the radicals, contained in the plasma generated from the gas supplied into the first chamber 22 by the microwave supplied to the first plasma generation space 22*d*, to the outside of the first chamber 22. In this embodiment, the outside of the first chamber 22 is the third chamber 10. The radicals contained in the plasma are the active species of the gas. The electromagnetic wave supplies 36 are arranged in the vertical direction along the axis AX that is the center line of the flat first chamber 22. Further, the gas supply 22*c* is provided on the third wall 22*f* that is perpendicular to the first wall 22*a* and the second wall 22*b* among the plurality of walls constituting the first chamber 22. The third wall 22*f* is a wall having the smallest area among the plurality of walls constituting the first chamber 22. Further, the gas supply 22*c* is formed on the third wall 22*f* above the first wall 22*a* on which the electromagnetic wave supplies 36 are mounted.

Thus, the plasma density is highest near the center of the flat first chamber 22, by the microwave supplied through the dielectric window 38 of the electromagnetic wave supply 36. In addition, the gas and the radicals flow through the center of the flat first chamber 22 while diffusing from top to bottom.

The plasma supply 23 is provided at a position facing the third wall 22*f* of the first chamber 22. With this configuration, the vicinity of the upper electromagnetic wave supply 36 among the electromagnetic wave supplies 36 arranged in the vertical direction that is the flow direction of the gas becomes a first dissociation area in which gas dissociation is promoted. Further, the vicinity of the lower electromagnetic wave supply 36 becomes a second dissociation area in which gas dissociation is promoted. Because the gas dissociated in the first dissociation area is further dissociated in the second dissociation area, a gas dissociation degree increases as it goes downward in the vertical direction in the first plasma generation space 22*d* of the first chamber 22. Thus, high-density plasma is generated in the first chamber 22. Thereby, the plasma supply 23 can supply a sufficient amount of radicals to the third chamber 10.

In this way, the radicals are supplied from the plasma source 1 to the third plasma generation space 30*e* between the lower electrode (mounting table 18) and the upper electrode (shower head 20), and the substrate W mounted on the lower electrode is processed. At this time, the radicals flow from the plasma source 1 via the plurality of gas holes 20*i* provided in the shower head 20 through the shower head 20, and is supplied to the third plasma generation space 30*e*. The radicals supplied to the third plasma generation space 30*e* may be recombined into gas during transfer. The radicals and the recombined gas are decomposed by the high-frequency power of the high frequency power supply 60, and the plasma generated by this is used to perform a process such as film formation on the substrate W. By supplying the radicals from the plasma source 1, even if the high-frequency power supplied from the high frequency power supply 60 is small and the frequency is relatively low, sufficient dissociation is possible. Thus, it is possible to perform film formation on the substrate W with less damage. Although not shown, gas that can be sufficiently dissociated only by the high frequency power supply 60 may be directly supplied to the shower head 20 without passing through the plasma source 1.

A controller (control device) 90 may be a computer having a processor 91 and a memory 92. The controller 90 is provided with a calculation part, a storage part, an input device, a display device, a signal input/output interface, etc. The controller 90 controls each component of the plasma processing apparatus 2 including the plasma source 1. In the controller 90, an operator can perform a command input operation or the like to manage the plasma processing apparatus 2 using the input device. Further, the controller 90 can visualize and display the operating status of the plasma processing apparatus 2 by the display device. Furthermore, a control program and recipe data are stored in the memory 92 of the controller 90. The control program is executed by the processor 91 of the controller 90 in order to execute various processes in the plasma processing apparatus 2. The processor 91 executes the control program and controls each component of the plasma processing apparatus 2 according to the recipe data, so that various processes, e.g. a plasma processing method, are executed in the plasma processing apparatus 2.

With the above configuration, according to the plasma processing apparatus 2 of this embodiment, sufficient radicals can be supplied to the third chamber 10 by using the plasma source 1 that generates the plasma by the electromagnetic wave having a relatively high frequency and activates the gas. Thus, it is possible to perform a process with less damage on the substrate W by using the remote plasma source using the microwave.

Further, the plasma source 1 according to this embodiment has the plasma ignition source 24. The plasma ignition source 24 is provided in the first chamber 22 to protrude from the inner wall of the second wall 22*b* facing the dielectric window 38 and to be separated from the dielectric window 38.

Here, the ignition of the plasma by the plasma ignition source 24 will be described. In the plasma ignition using the microwave as in the plasma source 1, ignition performance is determined by a discharge electric field ad represented by Equation (1).

[Equation 1]

$$E_{bd} = Dp^{m}\left[1 + \frac{(2\pi f)^2}{(Kp)^2}\right]^{1/2} \tag{1}$$

On the other hand, in a parallel plate type of plasma processing apparatus such as the third chamber 10, ignition performance is determined by discharge voltage $V_{bd}$ represented by Equation (2), according to Paschen's law, by a discharge by the high-frequency power between the lower electrode and the upper electrode.

[Equation 2]

$$V_{bd} = \left( \frac{Bpd}{In(Apd) - In[In(1 + 1/\gamma_{se})]} \right) \tag{2}$$

Further, in Equation (1), D and K are coefficients determined by the gas species, p is a pressure in the chamber, and f is the frequency of the electromagnetic wave. M is a constant (generally 0.5) determined by the gas species. Further, in Equation (2), A and B are coefficients determined by the gas species, p is a pressure in the chamber, d is a distance between the lower electrode and the upper electrode, and $\gamma_{se}$ is a secondary electron emission coefficient. The secondary electron emission coefficient is a coefficient determined by the material and surface condition of the lower electrode and the upper electrode.

That is, in the plasma source 1, Paschen's law is not satisfied in the plasma ignition. Therefore, in the plasma source 1, the ignition performance is not determined by the discharge voltage $V_{bd}$ represented by Equation (2). In the plasma source 1, if the discharge electric field $E_{bd}$ represented by Equation (1) is strengthened, ignition is facilitated. Thus, the plasma ignition source 24 included in the plasma source 1 has a shape and an arrangement that allow easy ignition, which are peculiar to the microwave and the VHF wave having the frequency of 150 MHz or more, and facilitate the ignition of plasma in the first chamber 22.

Specifically, the plasma ignition source 24 is provided in the first chamber 22 to protrude from the inner wall of the second wall 22*b* facing the dielectric window 38 and to be separated from the dielectric window 38. If the microwave is emitted into the flat first chamber 22 when no plasma is generated in the first chamber 22, the emitted microwave is reflected from the rod-shaped conductor of the plasma ignition source 24 protruding from the facing surface, and the microwave (reflected wave) returns to the inner wall of the first wall 22*a*. Then, a standing wave is generated between the incident wave of the microwave output from the dielectric window 38 and the reflected wave reflected from the plasma ignition source 24. Because the first chamber 22 is flat and a gap between the first wall 22*a* and the second wall 22*b* is narrow, a high electric field is generated in the first chamber 22 and the plasma is easily ignited. On the other hand, after the plasma ignition, the electric field between the plasma ignition source 24 and the inner wall of the first wall 22*a* is not increased.

The plasma ignition source 24 has a conductive rod-shaped member, and has, for example, a tip having a shape similar to a tip of a mushroom (the cross section of the tip is substantially trapezoidal). The entire portion or tip portion of the plasma ignition source 24 may be covered with an insulator. Further, as the installation form of the rod-shaped member of the plasma ignition source 24, for example, there are three patterns of FIGS. 4A to 4C.

Figure 4A:
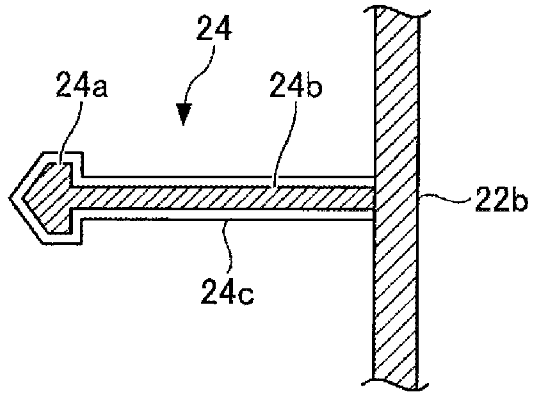
FIGS. 4A to 4C are a diagram illustrating a plasma ignition source according to an embodiment.

In FIG. 4A, the plasma ignition source 24 has a rod-shaped member 24*b* (including a tip portion 24*a*) that is a conductor, and a surface thereof is coated with an insulating member 24*c* such as ceramics. The internal rod-shaped member 24*b* is at the same potential as the first chamber 22, and is at the ground potential.

Figure 4B:
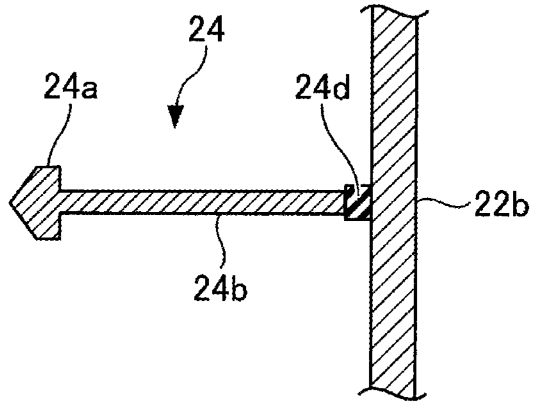

In FIG. 4B, an insulating member 24*d* is sandwiched between the inner wall of the second wall 22*b* that is a wall facing the first wall 22*a* and the rod-shaped member 24*b* (including the tip portion 24*a*), and the rod-shaped member 24*b* itself is set to the floating potential.

Figure 4C:
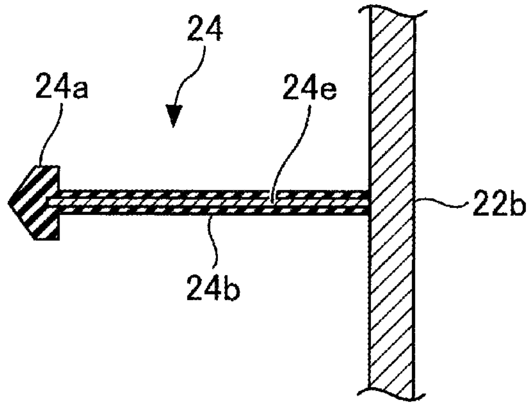

In FIG. 4C, the rod-shaped member 24*b* (including the tip portion 24*a*) itself is made of an insulating member such as ceramics, and an electrode 24*e* functioning as a passive ignition source is disposed therein.

The plasma ignition source 24 is a passive ignition source, and a voltage is not applied to itself. The plasma ignition source 24 needs to have an electrode (conductor) for reflecting the microwave. Therefore, a form of the plasma ignition source 24 may be any form in which the electrode (conductor) for functioning as the passive ignition source is provided in the vicinity of the dielectric window 38, without being limited to the form of FIGS. 4A to 4C. Further, the conductor portion of the rod-shaped member of the plasma ignition source 24 may have the ground potential or the floating potential, but the floating potential is more preferable to the ground potential. The conductor portion of the rod-shaped member of the plasma ignition source 24 functions as the passive ignition source even at the ground potential. However, in view of contamination, particles, and damage, it is preferable that the rod-shaped member (electrode, conductor portion) of the plasma ignition source 24 has the floating potential. The reason will be described with reference to FIG. 5.

Figure 5:
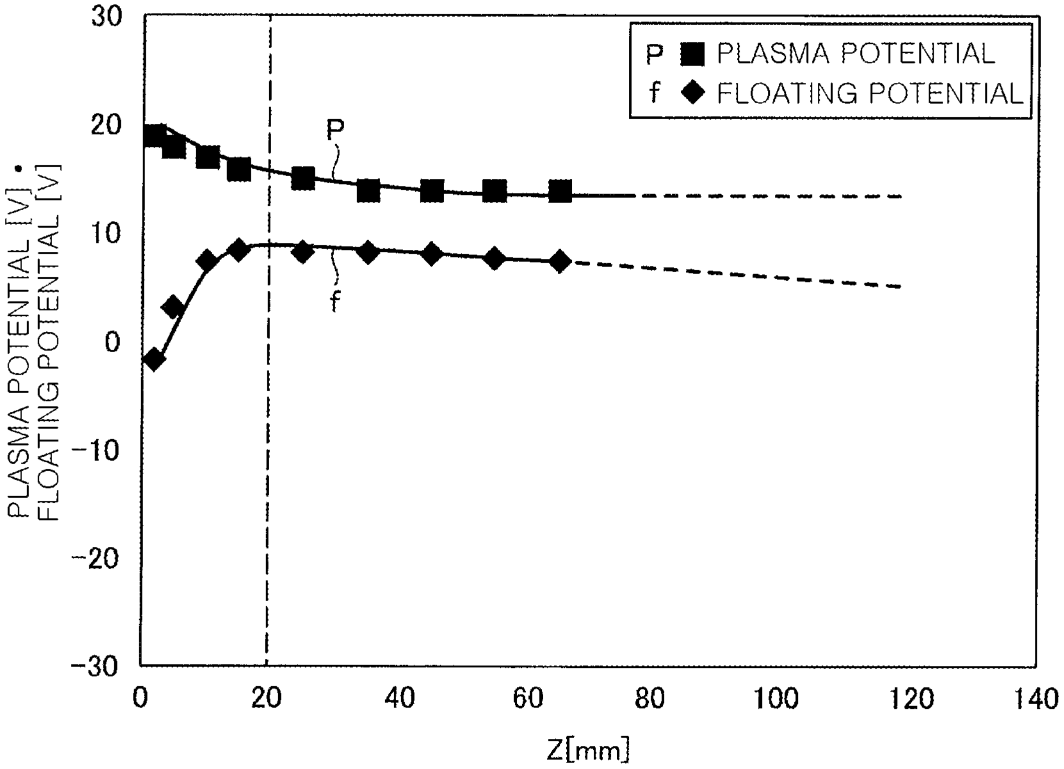
FIG. 5 is a graph illustrating an example of a relationship between a plasma potential and a floating potential.

FIG. 5 is a graph illustrating an example of a relationship between a plasma potential and a floating potential. The horizontal axis Z of the graph of FIG. 5 represents a distance Z from the surface of the dielectric window 38 to the electrode (conductor) tip of the plasma ignition source 24, while the vertical axis represents the plasma potential and the floating potential. A line P represents the plasma potential according to the distance Z, and a line f represents the floating potential according to the distance Z. The line f shows a case in which the plasma ignition source 24 is configured to have the floating potential. In this experiment, the pressure in the first chamber 22 was controlled to 0.5 Torr (67 Pa), Ar gas was supplied into the first chamber 22, and the plasma of the Ar gas was generated.

Accordingly, if the rod-shaped member of the plasma ignition source 24 has the ground potential, the plasma potential itself becomes an incident potential indicating force when ions are incident on the rod-shaped member. As a result, when Z is about 10 mm, the voltage of about 17 eV is applied to the rod-shaped member. On the other hand, if the rod-shaped member has the floating potential, the voltage of about 10 eV is applied to the rod-shaped member when Z is about 10 mm, and the voltage applied to the rod-shaped member can be reduced by a potential difference between the plasma potential of the line P and the floating potential of the line f. If the rod-shaped member is coated with ceramics, at the voltage of about 10 eV, the surface of the plasma ignition source 24 is hardly damaged.

From the above, the tip of the plasma ignition source 24 and the bottom surface of the dielectric window 38 may be separated by about 3 mm to 10 mm in a horizontal direction (direction perpendicular to the axis AX). However, it is more preferable that the tip of the plasma ignition source 24 and the bottom surface of the dielectric window 38 are separated by about 5 mm to 10 mm, because contamination, particles, and damage can be further suppressed.

The plasma ignition source 24 can shorten time for turning on the plasma. This reason will be described. In a normal matching device, first, a matching position in the matching device is adjusted to a plasma ignition position. After the plasma ignition, the matching position is mechanically moved to a next matching position (matching position after the plasma ignition). It takes time to mechanically move the matching position.

On the other hand, the plasma source 1 is configured to be preset at the matching position after the plasma ignition. Although the plasma is not normally ignited at the matching position after the plasma ignition, the plasma is easily ignited even at the matching position after the plasma ignition, by providing the plasma ignition source 24 in the plasma source 1. Therefore, after the plasma is ignited, it is not necessary to move the matching position.

Therefore, the plasma ignition source 24 does not need to move the matching position, and can reduce time for turning on the plasma. Thereby, since the plasma can be rapidly ignited by changing the gas, this configuration is more suitable for an ALD (atomic layer deposition) process, and productivity can be increased. However, this can also be applied to film formation using a CVD (Chemical Vapor Deposition) method.

A distance between the first wall 22*a* and the inner wall of the second wall 22*b* is 10 to 100 times a skin depth of the plasma. The reason why the distance is in the range of 10 to 100 times is because a plasma conductivity shown below is significantly changed depending on a plasma density. In this embodiment, the distance between the first wall 22*a* and the inner wall of the second wall 22*b* is about 20 mm (see FIG. 1).

The value of skin depth changes depending on (1) frequency, (2) electron density, and (3) collision frequency of electrons and neutral particles. Here, (3) the collision frequency of electrons and neutral particles are determined by the gas species and the electron temperature. The skin depth δ is calculated by Equation (3).

$$\text{Skin depth } \delta=[2/(\omega\mu_0\sigma_{dc})]^{1/2} \quad (3)$$

where ω is a power supply frequency, to is the magnetic permeability in vacuum, and $\sigma_{dc}$ is a plasma conductivity. The plasma conductivity is calculated by Equation (4).

$$\text{Plasma conductivity } \sigma_{dc}=e^2n_e/(mv_m) \quad (4)$$

where e is an elementary charge, $n_e$ is an electron density, m is an electron mass, and $v_m$ is the collision frequency of electrons and neutral particle.

If the distance between the first wall 22*a* and the inner wall of the second wall 22*b* is 10 times the skin depth, the distance becomes about 20 mm when the frequency of the microwave is 800 MHz, becomes about 28 mm when the frequency is 400 MHz, and becomes about 12 mm when the frequency is 2.45 GHz. Thereby, it is possible to realize the plasma source 1 having plasma that is low in electron temperature and is high in electron density. Further, the pressure in the first chamber 22 is 0.5 Torr or more.

According to the above-described plasma source 1, gas decomposition efficiency and radical generation efficiency can be improved by reducing the thickness of the first chamber 22 and arranging the electromagnetic wave supplies 36 side by side in the direction in which gas flows. Further, by arranging the plasma ignition source 24 to correspond to the electromagnetic wave supply 36, it is possible to provide the plasma source 1 that stably facilitates the plasma ignition, based on the above-described ignition principle peculiar to the microwave. Further, time for turning on plasma can be shortened by the plasma ignition source 24. Thereby, productivity can be improved especially in the ALD process. In the ALD process, for example, in the case of forming an SiN film, a process in which raw gas such as silane gas ($SiH_4$) is supplied from the gas supply source 50 and then reduction gas such as nitrogen gas ($N_2$) is supplied is repeated. In the CVD process, for example, the silane gas ($SiH_4$) and the nitrogen gas ($N_2$) are supplied from the gas supply source 50. In the case of cleaning, cleaning gas such as $NF_3$ gas is supplied from the gas supply source 50.

Second Embodiment

[Plasma Processing Apparatus]

Figure 6:
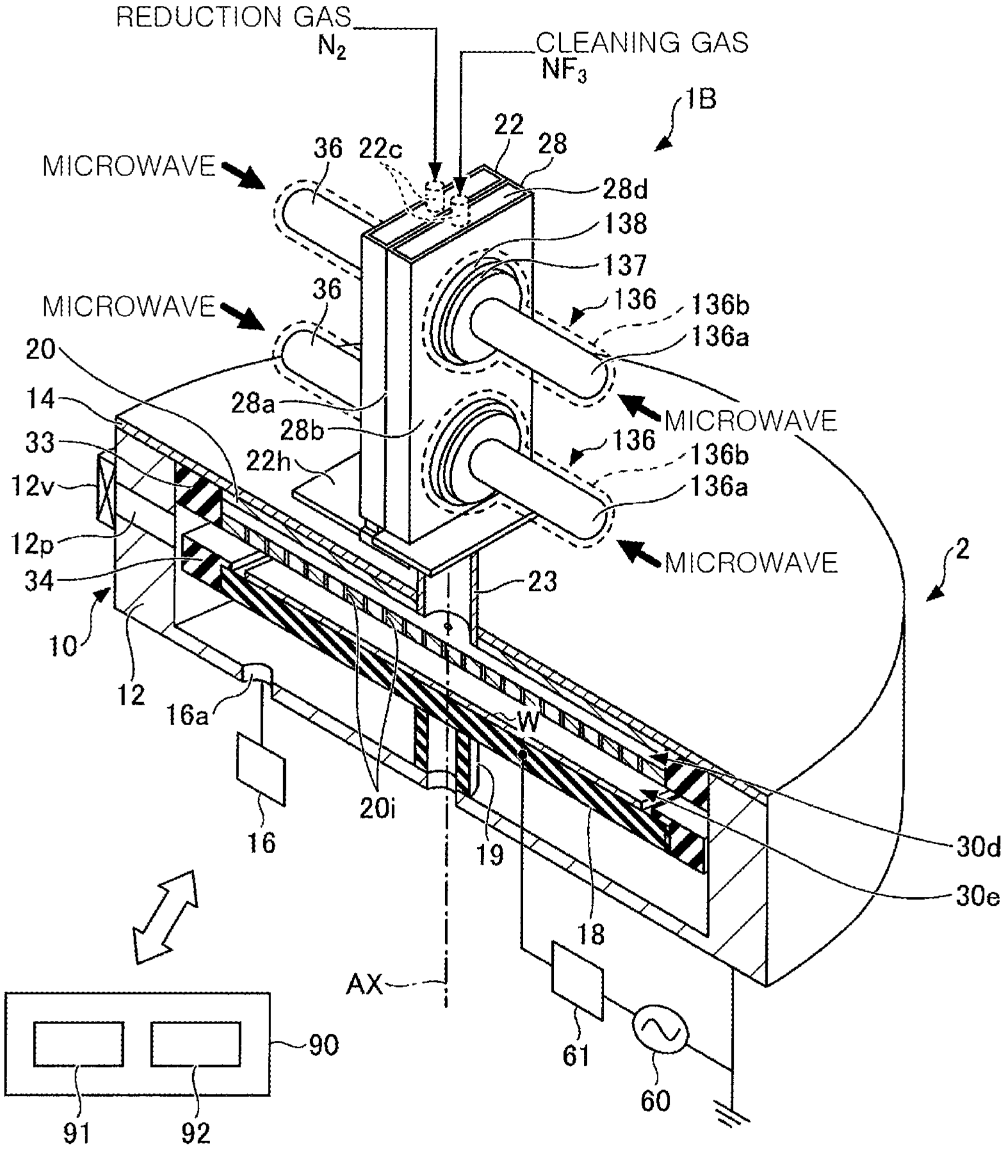
FIG. 6 is a schematic sectional view illustrating a plasma processing apparatus according to a second embodiment.

Next, a plasma processing apparatus 2 according to a second embodiment will be described with reference to FIG. 6. FIG. 6 is a cross-sectional perspective view illustrating the plasma processing apparatus 2 according to the second embodiment. Since the configuration of the third chamber 10 of the plasma processing apparatus 2 according to the second embodiment is the same as that of the first embodiment, a description thereof will be omitted, and a plasma source 1B according to the second embodiment will be described.

The plasma source 1B according to the second embodiment has a second chamber 28 and an electromagnetic wave supplies 136, in addition to the first chamber 22 and the electromagnetic wave supplies 36 of the plasma source 1 according to the first embodiment. Since the configuration of the first chamber 22 and the electromagnetic wave supplies 36 included in the plasma source 1B according to the second embodiment is the same as that of the plasma source 1 according to the first embodiment, a description thereof will be omitted.

The second chamber 28 has the same shape as the first chamber 22, and is configured to form a flat second plasma generation space 28*d*. The second chamber 28 has a fourth wall 28*a* adjacent to the second wall 22*b* of the first chamber 22, and a fifth wall 28*b* facing the fourth wall 28*a*.

Similarly to the first chamber 22, the gas supply 22*c* is provided in the center of the upper wall of the second chamber 28 and above the dielectric window 138 of the electromagnetic wave supply 136. The gas supply 22*c* supplies gas different from gas supplied into the first chamber 22 into the second chamber 28. For example, the gas supply 22*c* may alternately supply silane gas and $N_2$ gas into the first chamber 22, and supply the cleaning gas into the second chamber 28.

The electromagnetic wave supply 136 has the same configuration as the electromagnetic wave supply 36, and has an inner conductor 136*a* and an outer conductor 136*b*. The electromagnetic wave supply 136 is provided at the same height as the electromagnetic wave supply 36 while facing the electromagnetic wave supply 36. However, without being limited thereto, the electromagnetic wave supply 136 may be provided at a height different from that of the electromagnetic wave supply 36 while facing the electromagnetic wave supply 36. In this case, one electromagnetic wave supply 136 is disposed between the electromagnetic wave supplies 36. Two electromagnetic wave supplies 136 are installed in the direction (vertical direction) of the gas flowing in the second chamber 28 downward from the gas supply 22*c*.

The electromagnetic wave supply 136 has a dielectric window 138 that is provided in an opening (not shown) provided in the fifth wall 28*b* to face the second plasma generation space 28*d*, and is configured to supply the microwave into the second chamber 28 through the dielectric window 138.

The gas supplied into the second chamber 28 is decomposed in the second plasma generation space 28*d* by the microwave, and plasma is generated. The plasma supply 23 supplies radicals contained in the plasma to the third chamber 10 outside the second chamber 28. For example, the plasma supply 23 supplies the radicals contained in the plasma of the silane gas and the reduction gas (e.g. $N_2$ gas) generated in the first plasma generation space 22*d* to the third chamber 10. Further, the radicals contained in the plasma of the cleaning gas (e.g. $NF_3$ gas) generated in the second plasma generation space 28*d* is supplied to the third chamber 10.

In FIG. 6, the plasma ignition source (not shown) disposed in the second plasma generation space 28*d* is provided in the second chamber 28 to protrude from the inner wall of the fourth wall 28*a* opposite to the dielectric window 138 and to be separated from the dielectric window 138. The configuration of the plasma ignition source 24 may be any one of those shown in FIG. 4.

Further, the plasma source 1B according to the second embodiment has an on/off gas valve 22*h* to control the supply (ON) and stop (OFF) of different radicals (gases), i.e., the radicals (gas) supplied from the first chamber 22 to the third chamber 10 and the radicals (gas) supplied from the second chamber 28 to the third chamber 10.

When supplying two different types of radicals (gases), it is preferable to excite them separately in different chambers and then supply them to the third chamber 10. For example, when a process gas such as $N_2$ gas or silane gas flows in the same chamber as the chamber in which $NF_3$ gas flowed, the effect of fluorine remaining in the chamber due to the $NF_3$ gas may reduce the accuracy of the process applied to the substrate. Thus, the plasma source 1B of this embodiment has two chambers, and different types of gases are separately supplied into the respective chambers. The plasma source 1B has a plate-shaped on/off gas valve 22*h* near outlets of the first chamber 22 and the second chamber 28. The on/off gas valve 22*h* opens or closes the first plasma processing space 22*d* (reduction gas excitation part) in the first chamber 22 and the third plasma processing space 30*e* (substrate processing space). Further, the on/off gas valve 22*h* opens or closes the second plasma processing space 22*d* (cleaning gas excitation part) in the second chamber 28 and the third plasma processing space 30*e* (substrate processing space). The on/off gas valve 22*h* may be slid to control opening and closing in the manner of a gate valve. Further, raw gas (reaction gas) such as silane gas may be directly supplied to the third chamber 10.

Also in the plasma source 1B according to the second embodiment, gas decomposition efficiency and radical generation efficiency can be improved by reducing the thicknesses of the first chamber 22 and the second chamber 28. Further, plasma ignition can be facilitated. Furthermore, by preventing two types of gases from being mixed and further installing the on/off gas valve 22*h*, excited species of different gases are prevented from being mixed into the chambers 22 and 28. This can eliminate effect on the substrate processing process caused by flowing different gas species into the same chamber. Further, by providing the electromagnetic wave supplies 36 and 136 in both the first chamber 22 and the second chamber 28, the number of the electromagnetic wave supplies 36 and 136 can be increased and the radical generation efficiency can be further enhanced.

Further, the plasma ignition source 24 can be configured as an insulating probe to detect a plasma state. Thereby, by analyzing a signal acquired from the insulating probe by a computer connected to the plasma ignition source 24, an electron density and an electron temperature in the first chamber 22 and the second chamber 28 can be monitored, and the plasma state can be analyzed.

In this case, the plasma state may be detected by opening a measurement window in the first chamber 22 and the second chamber 28 and installing a plasma measurement monitor (OES; Optical Emission Spectrometer, insulating probe, etc.).

The plasma processing apparatus 2 according to each embodiment described above has the plasma sources 1 and 1B functioning as remote plasma that converts gas into plasma by the electric field of the microwave or the VHF wave, improves gas decomposition efficiency and radical generation efficiency, and transfers a generated radicals (active species of gas) to the third chamber 10. By transferring the radicals generated in the plasma sources 1 and 1B to the third chamber 10, plasma formation can be performed with smaller power in the third chamber 10, and film formation with less damage can be performed by the ALD method.

The plasma source and the plasma processing apparatus according to each embodiment disclosed herein should be considered to be exemplary and not restrictive in all respects. The embodiments can be modified and improved in various forms without departing from the scope and spirit of the appended claims. The matters described in the above-described plurality of embodiments can have other configurations, and can be combined with each other unless they are contradictory to each other.

Furthermore, the plasma source 1 and the plasma source 1B may not have the plasma ignition source 24 in the first chamber 22 and/or the second chamber 28. In this case, the plasma source 1 and/or the plasma source 1B, including the first chamber 22 configured to form the flat first plasma generation space 22*d* and having the first wall 22*a* and the second wall 22*b* that have the largest area among the plurality of walls constituting the first chamber 22 and face each other, the gas supply 22*c* configured to supply gas into the first chamber 22, the electromagnetic wave supply 36 having the dielectric window 38 that is provided in the opening provided in the first wall 22*a* to face the first plasma generation space 22*d* and configured to supply the electromagnetic wave through the dielectric window 38 into the first chamber 22, and the plasma supply 23 supplying the radicals contained in the plasma that is generated from gas supplied into the first chamber 22 by the electromagnetic wave to the outside of the first chamber 22, is provided. A plurality of the electromagnetic wave supplies 36 are installed in the direction of flow of the gas flowing through the first plasma generation space 22*d* from the gas supply 22*c* toward the outside of the first chamber 22.

The invention claimed is:

1. A plasma source comprising:

a first chamber configured to form a flat first plasma generation space, and having a first wall and a second wall that have a largest area among a plurality of walls constituting the first chamber and face each other;

a gas supply configured to supply gas into the first chamber;

a plurality of electromagnetic wave supplies each having a dielectric window and configured to supply an electromagnetic wave through the dielectric window into the first chamber, wherein the dielectric window is installed on an outer wall of the first chamber, and a portion of the dielectric window is exposed to the first plasma generation space through an opening provided on the first chamber;

a plasma supply configured to supply radicals contained in plasma that is generated from the gas supplied into the first chamber by the electromagnetic wave to an outside of the first chamber; and a plasma ignition source provided in the first chamber to protrude from an inner wall of the second wall facing the dielectric window and to be separated from any of the dielectric window.

2. A plasma source comprising:

a first chamber configured to form a flat first plasma generation space, the first chamber having a first wall and a second wall that have a largest area among a plurality of walls constituting the first chamber and face each other, and having a third wall that is connected to both the first wall and the second wall;

a gas supply configured to supply gas into the first chamber, and provided on the third wall;

a plurality of electromagnetic wave supplies each having a dielectric window that is provided in an opening provided in the first wall to face the first plasma generation space, and configured to supply an electromagnetic wave through the dielectric window into the first chamber; and a plasma supply configured to supply radicals contained in plasma that is generated from the gas supplied into the first chamber by the electromagnetic wave to an outside of the first chamber, wherein the plurality of the electromagnetic wave supplies are arranged side by side along a direction of flow of the gas flowing through the first plasma generation space from the gas supply to the plasma supply, and wherein the third wall is disposed above the plurality of electromagnetic wave supplies.

3. The plasma source of claim 1, further comprising:

a second chamber configured to form a flat second plasma generation space, and having a third wall adjacent to the second wall and a fourth wall facing the third wall, wherein the gas supply configured to supply gas different from the gas supplied into the first chamber into the second chamber, each of the plurality of electromagnetic wave supplies further has an additional dielectric window provided in an opening provided in the fourth wall to face the second plasma generation space, and is configured to supply an electromagnetic wave through the additional dielectric window into the second chamber, the plasma supply is further configured to supply radicals contained in plasma that is generated from the gas supplied into the second chamber in the second plasma generation space by the electromagnetic wave to an outside of the second chamber, and the plasma ignition source is further provided in the second chamber to protrude from an inner wall of the third wall facing the additional dielectric window and to be separated from the additional dielectric window.

4. The plasma source of claim 3, wherein the gas supply supplies reduction gas to one of the first chamber and the second chamber, and supplies cleaning gas to the other of the first chamber and the second chamber.

5. The plasma source of claim 3, further comprising:

an on/off valve provided for each of the first chamber and the second chamber to control supply and stop of radicals of a reduction gas and a cleaning gas supplied to the plasma supply.

6. The plasma source of claim 1, wherein the plasma ignition source has a conductive rod-shaped member, a surface of the rod-shaped member is coated with an insulating member, and the rod-shaped member has a ground potential.

7. The plasma source of claim 1, wherein the plasma ignition source has a conductive rod-shaped member, an insulating member is sandwiched between the rod-shaped member and the inner wall of the second wall, and the rod-shaped member has a floating potential.

8. The plasma source of claim 3, wherein the plasma ignition source has a conductive rod-shaped member, an insulating member is sandwiched between the rod-shaped member and the inner wall of the third wall, and the rod-shaped member has a floating potential.

9. The plasma source of claim 1, wherein the plasma ignition source is an insulating rod-shaped member, and an electrode is provided in the rod-shaped member.

10. The plasma source of claim 1, wherein the plasma ignition source is configured to detect a state of the plasma as an insulating probe.

11. The plasma source of claim 1, wherein each of the plurality of electromagnetic wave supplies is configured to supply a VHF wave having a frequency band of 150 MHz or more or a microwave as the electromagnetic wave.

12. The plasma source of claim 1, wherein the gas supply is provided on a third wall that is perpendicular to the first wall and the second wall among the plurality of walls constituting the first chamber.

13. The plasma source of claim 1, wherein the gas supply is provided on a third wall having a smallest area among the plurality of walls constituting the first chamber.

14. The plasma source of claim 12, wherein the plasma supply is provided at a position facing the third wall of the first chamber.

15. The plasma source of claim 1, wherein a central region of the dielectric window is thinner than an outer peripheral region of the dielectric window.

16. The plasma source of claim 1, wherein a distance between an inner wall of the first wall and the inner wall of the second wall is 10 to 100 times a skin depth of the plasma.

17. A plasma processing apparatus comprising:

the plasma source of claim 1; and a second chamber connected to the plasma source, wherein the second chamber has a second plasma generation space for processing a substrate.

18. A plasma processing apparatus comprising:

the plasma source of claim 2; and a second chamber connected to the plasma source, wherein the second chamber has a second plasma generation space for processing a substrate.

19. The plasma processing apparatus of claim 17, further comprising:

a high frequency supply configured to supply a high frequency to a lower electrode on which the substrate is mounted in the second chamber or an upper electrode facing the lower electrode, wherein the radicals are supplied from the plasma source to the second plasma generation space between the lower electrode and the upper electrode to process the substrate mounted on the lower electrode.

20. The plasma processing apparatus of claim 19, wherein the upper electrode functions as a shower head having a plurality of gas holes, and the radicals are supplied from the plasma source through the plurality of gas holes provided in the shower head to the second plasma generation space.

* * * * *